United States Patent
Mazumder

(10) Patent No.: US 9,088,268 B2
(45) Date of Patent: Jul. 21, 2015

(54) INVALID SIGNAL FILTERING METHOD AND SHIFTER UTILIZING THE METHOD

(75) Inventor: Kallol Mazumder, Plano, TX (US)

(73) Assignee: NANYA TECHNOLOGY CORP., Gueishan Dist., Taoyuan (TW)

(*) Notice: Subject to any disclaimer, the term of this patent is extended or adjusted under 35 U.S.C. 154(b) by 163 days.

(21) Appl. No.: 13/531,580

(22) Filed: Jun. 24, 2012

(65) Prior Publication Data
US 2013/0342239 A1   Dec. 26, 2013

(51) Int. Cl.
   H04L 25/03    (2006.01)
   G11C 7/22     (2006.01)
   H03H 11/40    (2006.01)

(52) U.S. Cl.
   CPC . *H03H 11/40* (2013.01); *G11C 7/22* (2013.01)

(58) Field of Classification Search
   CPC .......................................................... G11C 7/22
   USPC .................................. 375/229; 327/153, 158
   See application file for complete search history.

(56) References Cited

U.S. PATENT DOCUMENTS

| | | | |
|---|---|---|---|
| 6,519,688 B1* | 2/2003 | Lu et al. | 711/167 |
| 6,862,250 B2* | 3/2005 | Shin | 365/233.17 |
| 7,092,314 B2* | 8/2006 | Setogawa | 365/189.14 |
| 7,656,745 B2* | 2/2010 | Kwak | 365/233.1 |
| 7,839,716 B2* | 11/2010 | Kong et al. | 365/233.13 |
| 2004/0119515 A1* | 6/2004 | Kim | 327/158 |
| 2004/0233773 A1* | 11/2004 | Shin | 365/233 |
| 2005/0135180 A1* | 6/2005 | Roohparvar | 365/230.06 |
| 2007/0008758 A1* | 1/2007 | Waldrop | 365/5 |
| 2009/0066380 A1* | 3/2009 | Redman-White | 327/158 |
| 2010/0223405 A1* | 9/2010 | Caltagirone et al. | 710/52 |
| 2011/0044116 A1* | 2/2011 | Choi et al. | 365/189.05 |

* cited by examiner

*Primary Examiner* — Kevin M Burd
(74) *Attorney, Agent, or Firm* — Winston Hsu; Scott Margo

(57) ABSTRACT

A shifter with invalid signal filtering mechanism, comprising: a first shifting stage, for receiving and capturing an input signal in a first clock cycle; and a second shifting stage, after the first shifting stage, for receiving the input signal from the first shifting stage, and for receiving a validity signal indicating whether the input signal is valid or invalid, before a second clock cycle next to the first clock cycle occurs; wherein the second shifting stage captures the input signal transmitted from the first shifting stage if the validity signal indicates that the input signal is valid, where the second shifting stage does not capture the input signal transmitted from the first shifting stage if the validity signal indicates that the input signal is invalid.

10 Claims, 4 Drawing Sheets

INVALID SIGNAL FILTERING METHOD AND SHIFTER UTILIZING THE METHOD

BACKGROUND OF THE INVENTION

1. Field of the Invention

The present invention relates to an invalid signal filtering method and a shifter utilizing the method, and particularly relates to an invalid signal filtering method and a shifter utilizing the method that can discard an invalid signal.

2. Description of the Prior Art

For DDR3, a mechanism is developed to filter out an illegal or invalid read command signal, which can be a read command signal given to an inactive bank. The decoded legal or valid read command signals generate "ValidRead" that is gated with dll-domain, which indicates a clock is processed by a DLL line thus is different from the clock inside the device, read that is sent to Qed shifter for sampling. The above decoding is a relatively slow process and may not occur before the dll-domain read exits the Delay-Line especially for shallow lock point situations. In this case, the rising edge of the "legal" read gets chopped off, leading to setup violation at Qed where the read fails to get sampled.

For an electronic device with higher operation frequency such as DDR4, the above-mentioned issue becomes more serious, since the decoding speed can not follow up the increasing operation speed. Therefore, a new approach to filter valid read command signal is needed.

SUMMARY OF THE INVENTION

Therefore, one objective of the present invention is to provide a new invalid signal filtering mechanism to filter invalid signal.

Another objective of the present invention is to provide a protecting mechanism to protect discarding a valid signal while filtering an invalid signal.

One embodiment of the present invention discloses an invalid signal filtering method, applied to a shifter including a first shifting stage and a second shifting stage after the first shifting stage, the invalid signal filtering method comprising: utilizing the first shifting stage to receive and to capture an input signal in a first clock cycle; determining if the input signal is valid or invalid, before a second clock cycle next to the first clock cycle occurs; and utilizing the second shifting stage to capture the input signal transmitted from the first shifting stage if the input signal is determined to be valid, and not utilizing the second shifting stage to capture the input signal transmitted from the first shifting stage if the input signal is determined to be invalid.

Another embodiment of the present invention discloses a shifter with invalid signal filtering mechanism, comprising: a first shifting stage, for receiving and capturing an input signal in a first clock cycle; and a second shifting stage, after the first shifting stage, for receiving the input signal from the first shifting stage, and for receiving a validity signal indicating whether the input signal is valid or invalid, before a second clock cycle next to the first clock cycle occurs; wherein the second shifting stage captures the input signal transmitted from the first shifting stage if the validity signal indicates that the input signal is valid, where the second shifting stage does not capture the input signal transmitted from the first shifting stage if the validity signal indicates that the input signal is invalid.

In view of above-mentioned embodiments, an invalid signal filtering mechanism that can match high operation frequency can be acquired. Besides, a mechanism for protecting a valid signal is also provided.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
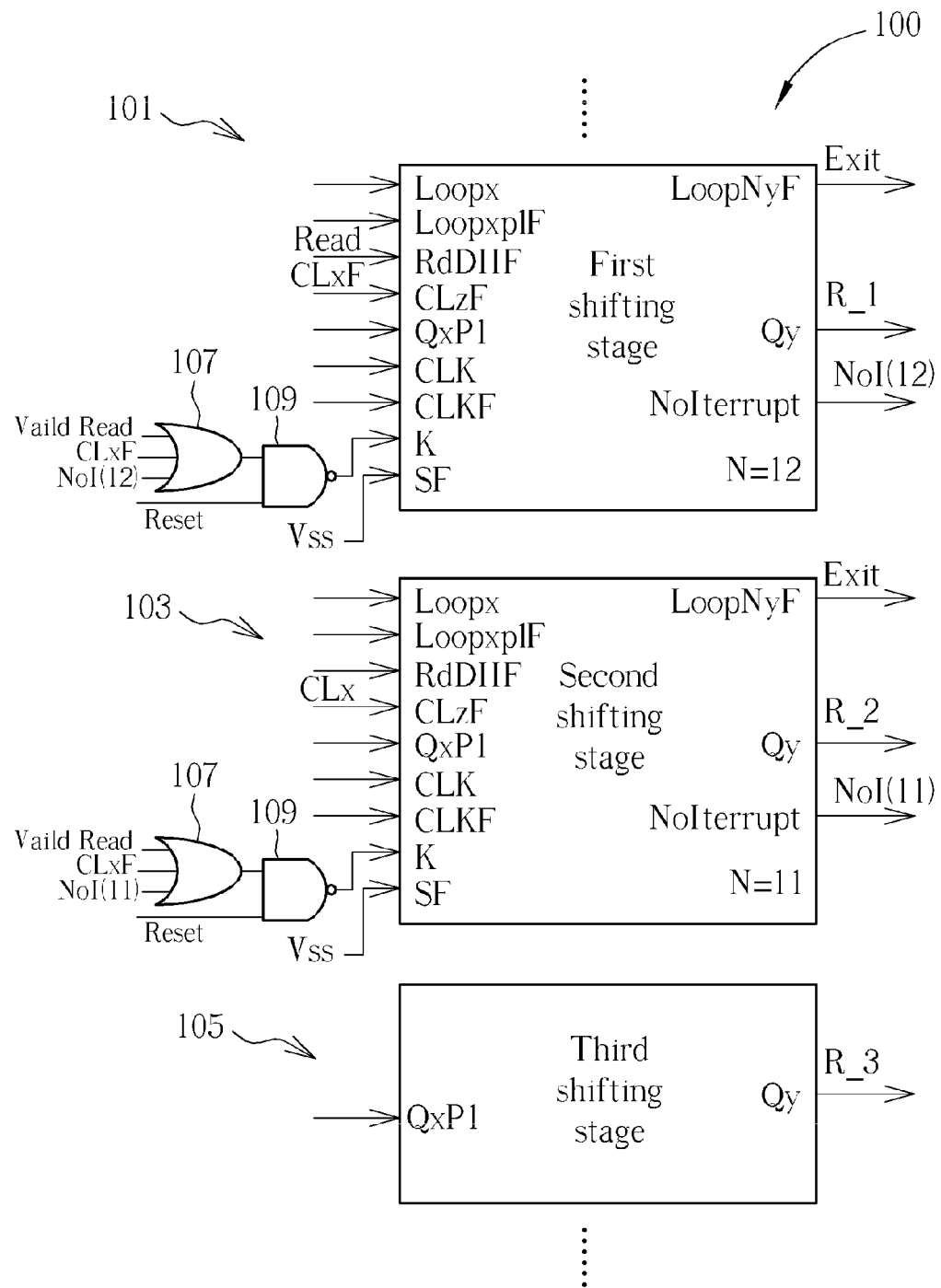
FIG. 1 is a block diagram illustrating a shifter with invalid signal filtering mechanism according to one embodiment of the present invention.

FIG. 1 is a block diagram illustrating a shifter 100 with invalid signal filtering mechanism according to one embodiment of the present invention. The shifter 100 includes a plurality of shifting stages, but only the first shifting stage 101, the second shifting stage 103, and the third shifting stage 105 are illustrated. Please note the first shifting stage 101 is not limited to be the real "first" (i.e. the beginning shifting stage) of the shifter 100. Also, the third shifting stage 105 is not limited to be the last shifting stage of the shifter 100. Additionally, in this embodiment the second shifting stage 103 is next to the first shifting stage 101, and the third shifting stage 105 is next to the second shifting stage 103. However, the second shifting stage 103 can be any stage after the first shifting stage 101, and the third shifting stage 105 can be any stage after the second shifting stage 103.

The first shifting stage 101, the second shifting stage 103, and the third shifting stage 105 all include terminals LoopNyF, Qy, NoInterrupt, Loopx, Loopxp1F, RdDIIF, CLzF, QxP1, CLK, CLKf, k, SF. Please note the terminals for the third shifting stage 105 are not illustrated for brevity. Also, for simplicity for the diagram, some major signals are marked by other terms such as Read, ClxF, but some signals are directly indicated by the terminals outputting or receiving it. The terminal CLzF receives an entry signal CLxF indicaing CAS latency determining the entry shifting stage, which the non filtered read command signal READ enters. The terminal LoopNyF outputs an exit signal Exit indicating exit shifting stage, which the read command signal READ exits. The terminal RdDIIF receives an unfiltered read command signal READ. The terminal CLK receives a DLL domain clock signal. The terminal Qy outputs sampled (captured) output data sampled in the circuit shown in FIG. 2 and then a masking signal NOI(N) is corresponding generated at the terminal NOIterrupt. The N of the masking signal NOI(N) indicates the corresponding stage, the same as the N shown in the stage. Terminals LooPx and Loopxp1F are terminals indicating the exit stage of the shifter 100. QxP1 terminal receives output of the previous-stage coming into this stage.

Also, the first shifting stage 101, the second shifting stage 103, and the third shifting stage 105 all include a logic circuit including an OR gate 107 and an NAND gate 109. The OR gate 107 receives a validity signal ValidRead indicating if the unfiltered read command signal READ is valid or invalid. Besides, the OR gate 107 further receives the entry signal CLxF.

Figure 2:
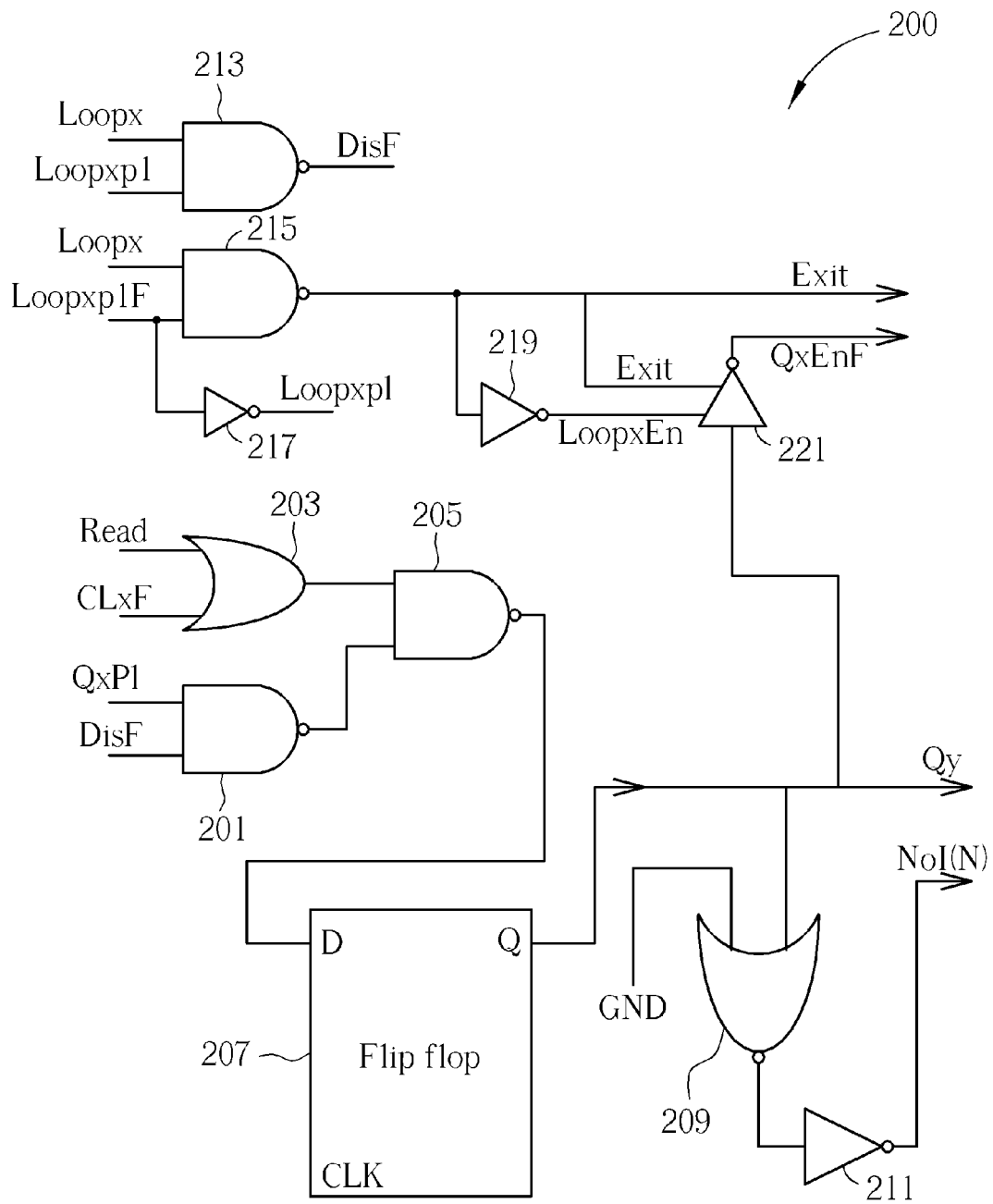
FIG. 2 is a circuit diagram illustrating an exemplary embodiment for generating captured read command signal, generating the masking signal and an entrance signal determining which shifting stage is the entrance stage.

In this embodiment, the unfiltered read command signal READ enters the first shifting stage 101, and the unfiltered read command signal is captured in the circuit shown in FIG. 2 in a first clock cycle CLK(1). The read command signal captured by the first shifting stage 101 is output at the Qy terminal of the first shifting stage 101. The second shifting stage 103 receives the read command signal from the first shifting stage 101 at the terminal QxP1 thereof, and receives the validity signal ValidRead indicating whether the read command signal is valid or invalid, before a second clock cycle CLK (2) next to the first clock cycle CLK (1) occurs. The second shifting stage 103 captures the read command signal transmitted from the first shifting stage if the validity signal ValidRead indicates that the unfiltered read command signal is valid. The second shifting stage 103 does not capture the read command signal transmitted from the first shifting stage if the validity signal indicates that the input signal is invalid. Many mechanisms can be utilized to determine if the read command signal is valid or invalid For example, decoding the read command signal and identifying the bank that is target at. Or, determining if the target bank is active or not. If the bank is active, the read command signal is valid, if not, the read command signal is invalid. In one embodiment, if the validity signal is high, it means the read command signal is valid. On the contrary, if the validity signal is low, it means the read command signal is invalid. Since such mechanism is known by persons skilled in the art, it is omitted for brevity here. Similarly, the third shifting stage 105 receives the read command signal from the Qy terminal of the second shifting stage 103 at the QxP1 terminal thereof, and outputs the captured read command signal at the Qy terminal thereof if the read command signal from the second shifting stage 103 is valid.

Figure 4:
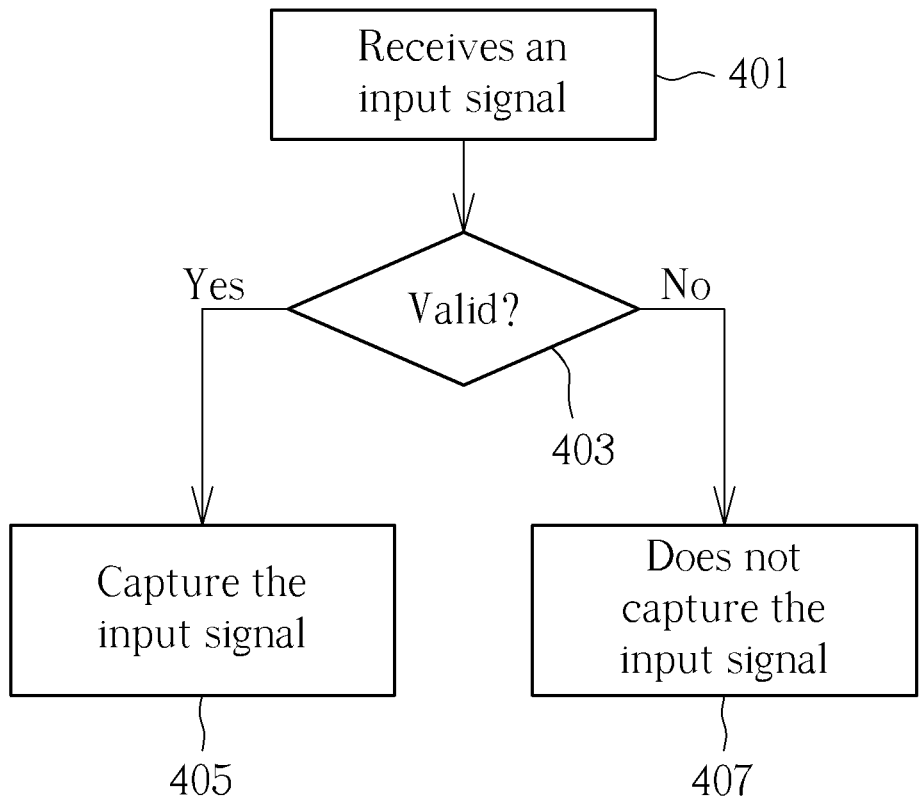
FIG. 4 is a flow chart illustrating the capturing operation for the shifting stage according to an embodiment of the present invention.

FIG. 4 is a schematic diagram illustrating operation for the shifter in FIG. 1. In FIG. 4, IRC indicates an invalid read command signal and LRC indicates a valid command signal. The unfiltered read command signal READ in FIG. 1 may comprise the invalid read command signal IRC or the valid command signal LRC. ValidRead indicates the validity signal ValidRead received by the OR gate 107 in FIG. 1. If the logic level for the validity signal ValidRead is high, it indicates the unfiltered read command signal READ is a valid read command signal thus it is captured. On the contrary, if the logic level for the validity signal ValidRead is low, it indicates the unfiltered read command signal READ is an invalid read command signal thus it is not captured. Via above-mentioned steps, the first shifting stage 103 outputs a read command signal R_1 at the Qy terminal thereof. The read command signal R_1 is shifted by the second shifting stage 103 to generate the read command signal R_2, if a validity signal ValidRead received by the second shifting stage 105.

As above-mentioned, the first shifting stage 101 captures the unfiltered read command signal in a first clock cycle CLK(1). the second shifting stage 103 receives the read command signal from the first shifting stage 101 at the terminal QxP1 thereof, and receives the validity signal ValidRead indicating whether the read command signal is valid or invalid, before a second clock cycle CLK (2) next to the first clock cycle CLK (1) occurs. FIG. 4 illustrates such operation. As shown in FIG. 4, the first shifting stage 101 captures the legal read command signal at the clock cycle CLK(1), thus the second shifting stage 101 receives the validity signal ValidRead before the second clock cycle CLK (2) to determine the read command signal R_2.

The NAND gate 109 further receives a reset signal Reset, such that the second shifting stage is reset via the reset signal Reset if the validity signal ValidRead indicates the read command signal is invalid.

Via above-mentioned mechanism, if the read command signal is valid, it will be transmitted to the next shifting stage and captured. On the contrary, if the read command signal is invalid, it will be discarded and will not be processed any longer. Such mechanism can solve the above-mentioned issue of decoding speed, since no complex decoding is needed.

The present invention further provides a mechanism to avoid discarding a valid read command signal. As shown in FIG. 1, the OR gate 107 further receives the masking signal NoI (N) corresponding to different stages. It is assumed that the read command signal is valid and is captured in the second clock cycle at the second shifting stage 103. Therefore, it must be guaranteed that the output of the second shifting stage 103 lasts for a full tCK, so that the third clock cycle clk(3) after the second clock cycle clk(2) can shift the valid read command signal from the second shifting stage 103 to the third shifting stage 105, just as the read command signal was shifted from the first shifting stage 101 to the second shifting stage 103 in the second clock cycle clk(2). There might be a situation where the valid signal ValidRead may turn off before this shift at clk(3) has taken place. In such a situation the masking signal NoI will mask the "ValidRead=low" information and keep the second shifting stage 103 from getting reset. The above-mentioned operation can be summarized as: if a read command signal is captured at any stage, the validity signal ValidRead can not be utilized to reset the same stage. The validity signal ValidRead can stop a read command signal from entering a stage, but once the read-command signal has entered a stage, ValidRead no longer has any influence on this particular stage.

FIG. 2 is a circuit diagram illustrating an exemplary embodiment circuit for generating captured read command signal, generating the masking signal NoI and an exit signal Exit determining which shifting stage is the exit stage. Such circuit is part of the shifter 100 shown in FIG. 1. In one embodiment, the circuit shown in FIG. 2 is included in the shifting stages shown in FIG. 1, but not limited. Please also refer to the block diagram shown in FIG. 1 to understand the connections between the block diagram in FIG. 1 and the circuit diagram in FIG. 2 for more clarity. In this embodiment, the input to the flip flop 207 is determined not only the non-filtered read command signal Read, the entry signal CLxF, but also a relay signal DisF and the previous stage output QxP1, then a captured read command signal Qy is generated by the flip flop 207. Also, the CLK terminal of the flip flop 207 indicates the CLK terminal illustrated in the shifting stage of FIG. 1.

The masking signal NoI is generated according to the captured read command signal Qy, the non-filtered read command signal Read, and the entry signal CLxF. The DisF signal is a "relay" signal, a command signal shifted through the shifter, and is generated by the signals received by Loopx and Loopxp1F. The command signal enters at the entry-point and exits at the exit-point in the shifter, as above-mentioned description. Typically the shifting-clock is running continuously when a read-burst is in progress. That means the shifter would keep on shifting the read command signal passing the exit-point even though there is no need to do so. The above "relay" signal stops this from happening and saves some power as shifting information unnecessarily wastes power.

The signal Exit is the signal that determines the exit-point of the shifter. For example, if this stage is the exit-point of the shifted command signal from the shifter, Exit would go low, enable the tristatable-driver and the output QxEnF would be low. Hence QxEnF is the actual command exiting the shifter. These QxEnF nodes would be wired-or among multiple sifter stages (as shown in FIG. 1) and only one stage (the exit-stage) would fire to deliver the output. The exit signal Exit is generated according to the signals from terminals Loopx and Loopxp1F, which is an inversed signal of the signal from the terminal Loopxp1. Specifically, the circuit 200 shown in FIG. 2 includes an NAND gate 201, an Or gate 203, an NAND gate 205, a flip flop 207, a NOR gate 209, an inverter 211, a NAND gate 213, an NAND gate 215, an inverter 217, an inverter 219 and an inverter 221. The Or gate 203 receive the non-filtered read command signal Read and the entry signal CLxF. The NAND gate 201 receive the signals QxP1 and the signal DisF. The NAND gate 205 receive the output of the NAND gate 201 and the Or gate 203 to generate an output inputted to the flip flop 207. The flip flop 207 is utilized to control the latency of the non-filtered read command signal Read. The NOR gate 209 receives the output Qy from the flip flop 207 as one input and generates the masking signal NOI(N).

Additionally, one input of the NOR gate 209 is coupled to a ground level. The output of the NOR gate 209 is processed by the inverter 211 such that the masking signal NoI is generated. Therefore, the devices 201-205, 207-211 can be regarded as a masking signal generating circuit.

The NAND gate 213 receives the signals Loopx and Loopxp1 to generate the signal DisF. The NAND gate 215 receives the signals Loopx and LoopxP1F to generate the exit signal Exit. The signal Loopxp1F is inverted to generate the signal Loopxp1, and the Exit signal is inverted to generate the LoopxEn. The captured read command signal Qy is inverted by the inverter 221 to generate the signal QxEnF.

Please note that the block diagram shown in FIG. 1 and the circuit diagram shown in FIG. 2 is only for example and do not mean to limit the scope of the present invention. Other circuits that can reach the same function should also fall in the scope of the present invention. Besides, the above-mentioned mechanism is not limited to filter invalid read command signal, it can also be utilized to filter any signal that is invalid or not needed.

Figure 3:
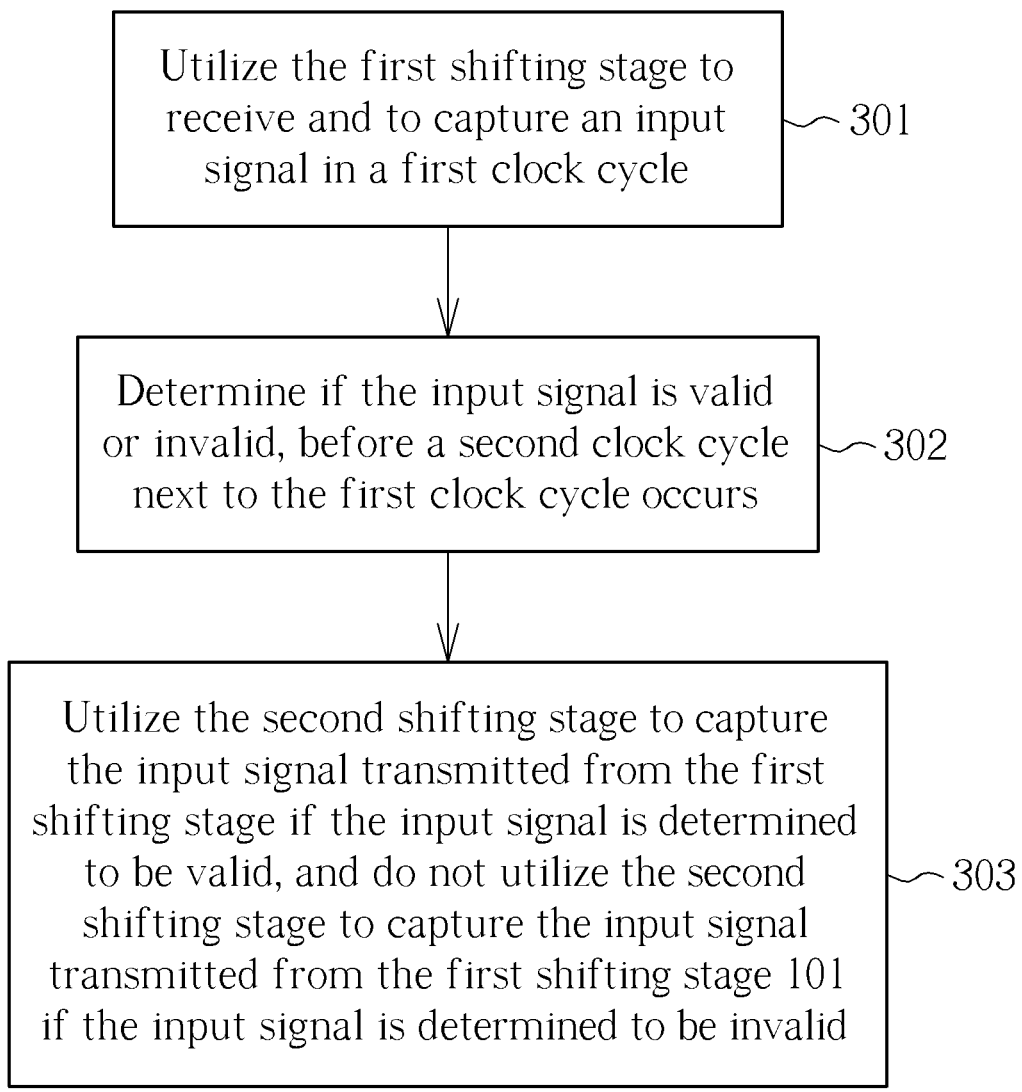
FIG. 3 is a flow chart illustrating an invalid signal filtering method according to one embodiment of the present invention.

In view of above-mentioned embodiments, an invalid signal filtering method can be acquired. FIG. 3 is a flow chart illustrating an invalid signal filtering method according to one embodiment of the present invention. As shown in FIG. 3, the flow chart includes:

Step 301
Utilize the first shifting stage, such as 101 in FIG. 1, to receive and to capture an input signal, such as the non filtered read command signal READ, in a first clock cycle CLK(1).

Step 303
Determine if the input signal is valid or invalid, before a second clock cycle CLK(2) next to the first clock cycle CLK (1) occurs.

Step 305
Utilize the second shifting stage 103 to capture the input signal transmitted from the first shifting stage 101 if the input signal is determined to be valid, and do not utilize the second shifting stage 103 to capture the input signal transmitted from the first shifting stage 101 if the input signal is determined to be invalid.

FIG. 4 is a flow chart to explain more detail capturing operations for the shifting stage.

Step 401
Receiving the input signal, which can come from a previous shifting stage (ex. the second shifting stage 103 receives output from the first shifting stage 103) or from other circuits.

Step 403
Determine if the input signal is valid or not based on the validity signal ValidRead. If yes, go to step 405, if not, go to step 407.

As above-mentioned, many mechanisms can be utilized to determine if the read command signal is valid or invalid For example, decoding the read command signal and identifying the bank that is target at. Or, determining if the target bank is active or not. If the bank is active, the read command signal is valid, if not, the read command signal is invalid.

Step 405
Capture the input signal.

Step 407
Does not capture the input signal.

In one embodiment, the first shifting stage 101 captures the input signal and then outputs to the second shifting stage 103. In such case, first shifting stage 101 captures the input signal in a first clock cycle of a clock signal received at the clock terminal CLK and the input signal transmitted to the second shifting stage 103 is determined to be valid or invalid before a second clock cycle next to the first clock cycle occurs.

Other detail characteristics can be obtained based upon above-mentioned embodiments, thus it is omitted for brevity here.

In view of above-mentioned embodiments, an invalid signal filtering mechanism that can match high operation frequency can be acquired. Besides, a mechanism for protecting a valid signal is also provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An invalid signal filtering method, applied to a shifter including a first shifting stage and a second shifting stage after the first shifting stage, the invalid signal filtering method comprising:
   utilizing the first shifting stage to receive and to capture an input signal in a first clock cycle;
   determining if the input signal is valid or invalid, before a second clock cycle next to the first clock cycle occurs; and
   utilizing the second shifting stage to capture the input signal transmitted from the first shifting stage if the input signal is determined to be valid, and not utilizing the second shifting stage to capture the input signal transmitted from the first shifting stage if the input signal is determined to be invalid;
   wherein the input signal is an unfiltered read command signal.

2. The invalid signal filtering method of claim 1, further comprising:
resetting the second shifting stage if the input signal is determined to be invalid.

3. The invalid signal filtering method of claim 2, wherein the shifter further comprises a third shifting stage after the second shifting stage, where the invalid signal filtering method comprises:
marking the second shifting stage if the input signal is determined to be valid, to make sure the second shifting stage is not reset before it transmits the input signal to the third shifting stage in a third clock cycle next to the second clock cycle.

4. A shifter with invalid signal filtering mechanism, comprising:
a first shifting stage, for receiving and capturing an input signal in a first clock cycle; and
a second shifting stage, after the first shifting stage, for receiving the input signal from the first shifting stage, and for receiving a validity signal indicating whether the input signal is valid or invalid, before a second clock cycle next to the first clock cycle occurs;
wherein the second shifting stage captures the input signal transmitted from the first shifting stage if the validity signal indicates that the input signal is valid, where the second shifting stage does not capture the input signal transmitted from the first shifting stage if the validity signal indicates that the input signal is invalid;
wherein the input signal is an unfiltered read command signal.

5. The shifter of claim 4, wherein the second shifting stage is reset if the validity signal indicates that the input signal is invalid.

6. The shifter of claim 5, further comprising:
a third shifting stage, after the second shifting stage;
a masking signal generating circuit, for generating a masking signal;
wherein the second shifting stage receives the masking signal to make sure the second shifting stage is not reset before it transmits the input signal to the third shifting stage in a third clock cycle next to the second clock cycle, if the validity signal indicates that the input signal is valid.

7. The shifter of claim 6, further comprising a flip flop for capturing the input signal to generate captured output signal, wherein the masking signal generating circuit generates the masking signal according to the input signal, a entry signal determining a shifting stage that the input signal enters and the captured input signal.

8. The shifter of claim 7, wherein the masking signal generating circuit further generates the masking signal according to output of a previous stage.

9. The shifter of claim 6, wherein the masking signal generating circuit comprises:
a first NAND gate, receiving output from a previous stage;
an Or gate, receiving the input signal and a entry signal determining a shifting stage that the input signal enters;
a second NAND gate, receiving output from the first NAND gate and the Or gate;
a flip flop, receiving output from the second NAND gate;
a NOR gate, receiving output from the flip flop and receiving a predetermined voltage;
an inverter, for receiving output from the NOR gate to generate the masking signal.

10. A shifter with invalid signal filtering mechanism, comprising:
a first shifting stage, for receiving and capturing an input signal in a first clock cycle; and
a second shifting stage, after the first shifting stage, for receiving the input signal from the first shifting stage, and for receiving a validity signal indicating whether the input signal is valid or invalid, before a second clock cycle next to the first clock cycle occurs;
a third shifting stage, after the second shifting stage;
a masking signal generating circuit, for generating a masking signal;
wherein the second shifting stage captures the input signal transmitted from the first shifting stage if the validity signal indicates that the input signal is valid, where the second shifting stage does not capture the input signal transmitted from the first shifting stage if the validity signal indicates that the input signal is invalid;
wherein the second shifting stage is reset if the validity signal indicates that the input signal is invalid;
wherein the second shifting stage receives the masking signal to make sure the second shifting stage is not reset before it transmits the input signal to the third shifting stage in a third clock cycle next to the second clock cycle, if the validity signal indicates that the input signal is valid;
wherein the masking signal generating circuit comprises:
a first NAND gate, receiving output from a previous stage;
an Or gate, receiving the input signal and a entry signal determining a shifting stage that the input signal enters;
a second NAND gate, receiving output from the first NAND gate and the Or gate;
a flip flop, receiving output from the second NAND gate;
a NOR gate, receiving output from the flip flop and receiving a predetermined voltage;
an inverter, for receiving output from the NOR gate to generate the masking signal.

* * * * *